(12) United States Patent
Chou

(10) Patent No.: US 7,095,637 B2
(45) Date of Patent: Aug. 22, 2006

(54) METHOD OF DETERMINING WORKING VOLTAGE OF INVERTER

(75) Inventor: Chin-Wen Chou, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 0 days.

(21) Appl. No.: 10/949,373

(22) Filed: Sep. 27, 2004

(65) Prior Publication Data

US 2006/0066257 A1    Mar. 30, 2006

(51) Int. Cl.
*H02M 1/12* (2006.01)
*H05B 37/02* (2006.01)

(52) U.S. Cl. .............................. 363/44; 363/40; 363/41; 315/209 R; 315/224

(58) Field of Classification Search ............ None
See application file for complete search history.

(56) References Cited

U.S. PATENT DOCUMENTS 6,556,457 B1 *    4/2003    Shimazaki et al. ........... 363/34

* cited by examiner

*Primary Examiner*—Tuyet Thi Vo
(74) *Attorney, Agent, or Firm*—Birch, Stewart, Kolasch & Birch, LLP.

(57) ABSTRACT

The present invention pertains to a method of determining a working voltage of an inverter, which utilizes a rectifying method to transform an alternating current into a pulse direct current, and then via a working frequency, divides a direct current cycle, which ranges in a lowest voltage–highest voltage–lowest voltage manner, into multiple continuous voltage pulses. The inverter receives each one of the multiple continuous voltage pulses and acts in response to each one of the multiple continuous voltage pulses and corresponding to the voltage cycle ranging between the lowest voltage and the highest voltage to output a variable voltage signal to a load. Thus, the working voltage of the inverter is analogous to the input voltage of the alternating current, and a power-factor regulating effect can be accomplished directly by the inverter.

6 Claims, 5 Drawing Sheets

METHOD OF DETERMINING WORKING VOLTAGE OF INVERTER

FIELD OF THE INVENTION

The present invention relates to a method of determining a working voltage of an inverter, particular to the working voltage whereby a power-factor regulating effect can be accomplished without utilizing a power-factor regulator.

BACKGROUND OF THE INVENTION

Most of the loads, coupled to a general alternating current distribution system, comprise resistive and inductive components, except the purely resistive loads such as an incandescent lamp or an electric stove. Therefore, the current phase angle of electric lines will lag behind the voltage. Generally, The total current, supplied through power transmission lines and distribution lines by a power company's generator, can be resolved into an active current part and a reactive current part according to the rated voltage of each load. The kilowatt-hour meter in the user end only records the active power. However, the reactive power will incur a line drop and a line loss. It's the loss both for the power company and the user. Consequently, how to accomplish a power-factor regulation is to be a subject, which the manufacturers of the user end systems desire to develop.

The technology of the power-factor regulation can be categorized into an active type and a passive type. The advantages of utilizing the power-factor regulation include reducing power loss, increasing load life and saving power expenditure. The power-factor is usually improved via a capacitor. The current power supply industry usually adopts a power-factor regulator to achieve the effect of outputting a stabilized voltage. Referring to FIG. 1, after a modification, the waveform of the working voltage of an inverter tends to be a ripple wave. However, in some part of the industry, this mode will incur troubles, which will be described below.

The output power of an inverter of a piezoelectric-transformer type is determined according to an input voltage. For the current power supplies, the output voltage is usually a smaller one, such as a stable 24 V or 48 V; therefore the output power of the inverter of the piezoelectric-transformer type is reduced responsively. The inverter of the piezoelectric-transformer type utilizes a piezoelectric effect induced by the mechanical stress of the vibration of piezoelectric sheets.

In the conventional method, when a power is supplied, the piezoelectric sheets have to maintain to operate at the voltage of 48V. As the piezoelectric sheets operate under the vibration induced by a single highest voltage in the conventional method, the life of the inverter of the piezoelectric-transformer type is apt to be reduced.

SUMMARY OF THE INVENTION

The primary objective of the present invention is to improve the aforementioned drawbacks, and to provide a method of determining a working voltage of an inverter, wherein a power factor regulator needn't be additionally installed thereto and the circuitry cost thereof is reduced.

According to one aspect of the present invention, a method of determining a working voltage of an inverter of the present invention utilizes a rectifying method to transform a cycle of an input alternating current into a cycle of a pulse direct current, and transform an alternating current signal into a direct current signal, and then sets a working frequency to divide each one cycle of the pulse direct current into multiple continuous voltage pulses, wherein one cycle of the pulse direct current varies in the lowest voltage–the highest voltage–the lowest voltage manner. The inverter receives each of the multiple continuous voltage pulses and acts in response to each of the multiple continuous voltage pulses, wherein the envelope of the multiple continuous voltage pulses ranges in the lowest voltage–the highest voltage–the lowest voltage manner in one direct current cycle, and outputs a variable voltage signal to a load; thus the working voltage of the inverter is analogous to the input voltage of the alternating current, and a power-factor regulating effect can be accomplished directly by the inverter.

Another object of the present invention is to provide a method, wherein the inverter operates under smooth-rising and smooth-dropping continuous voltage pulses in contrast to that the inverter operates under vibrations of only one single high voltage in the conventional method, in order to increase the life of the inverter.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Referring to the attached drawings, the detailed description of the present invention will be stated below.

For the examiners' definite understanding of the present invention, the embodiments, with respect to inverters utilizing a piezoelectric transformer, will be selected to be described herein, and as the embodiments, with respect to inverters utilizing a winding transformer, operate similarly, those will not be repeated herein. Figures of voltage or current waveforms will be utilized to aid the description herein.

Figure 1:
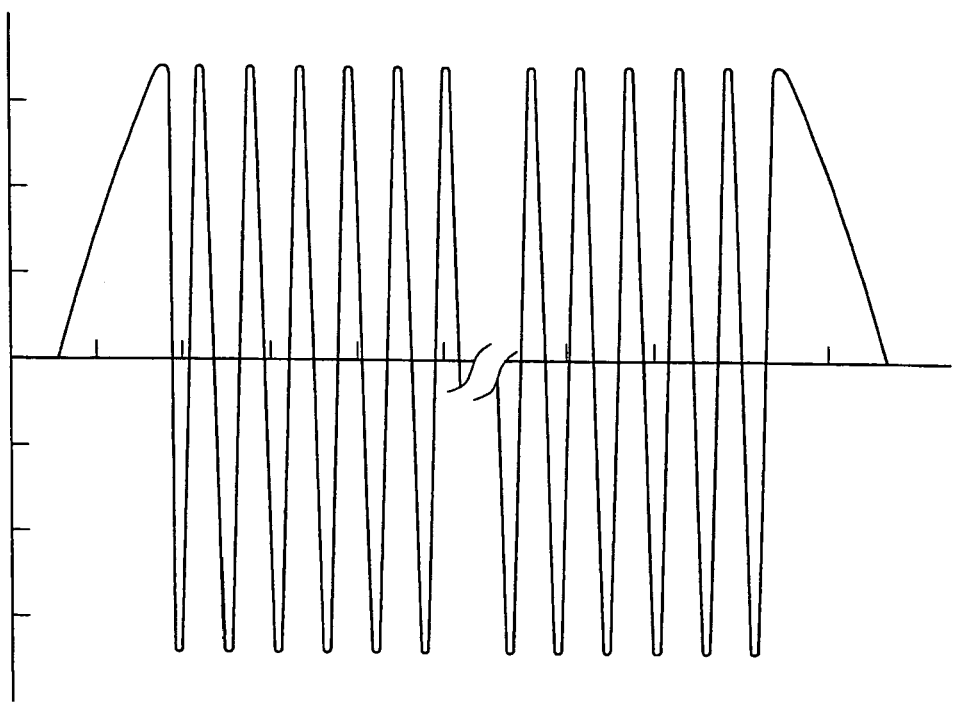
FIG. 1 is a schematic diagram showing the input voltage waveform of the inverter utilizing a piezoelectric transformer in a conventional method.
Figure 2:
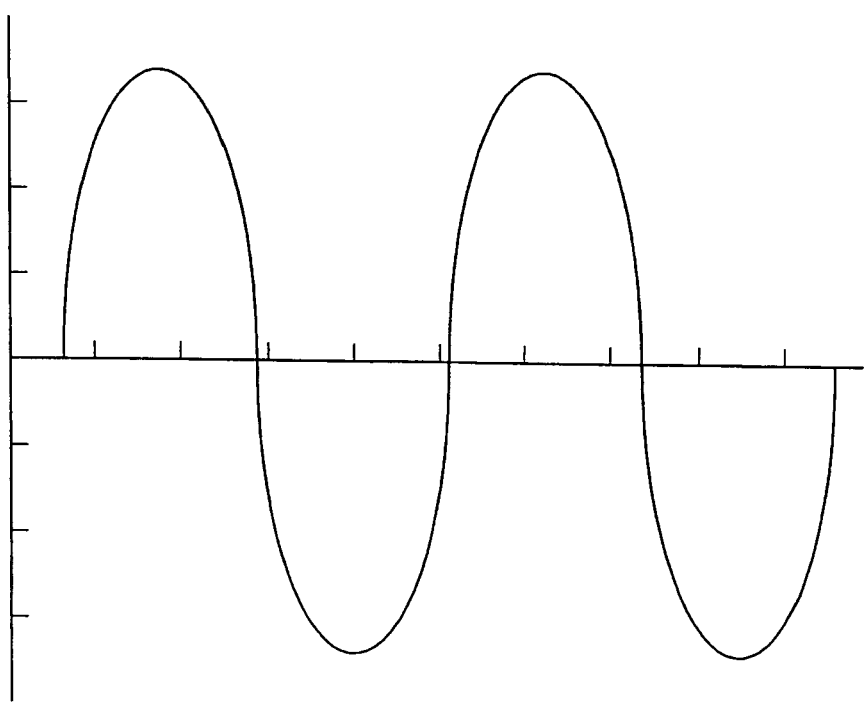
FIG. 2 is a schematic diagram showing the voltage waveform of an input alternating current in the present invention.
Figure 3:
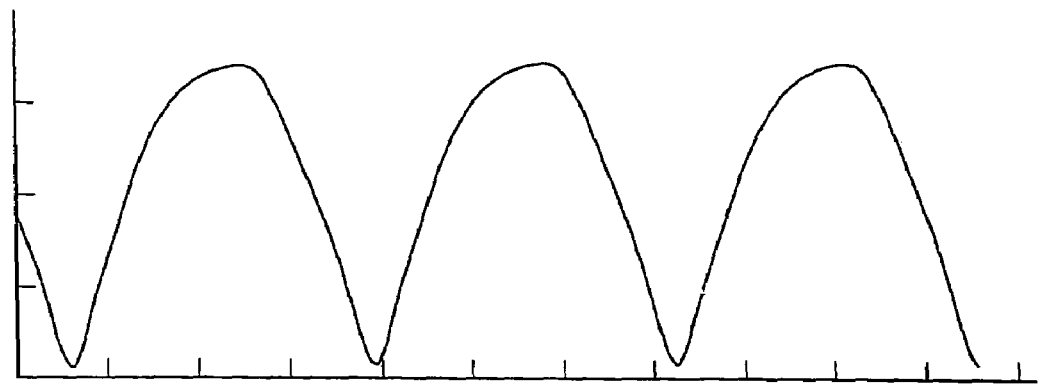
FIG. 3 is a schematic diagram showing the voltage waveform presented after a rectifying method.
Figure 4:
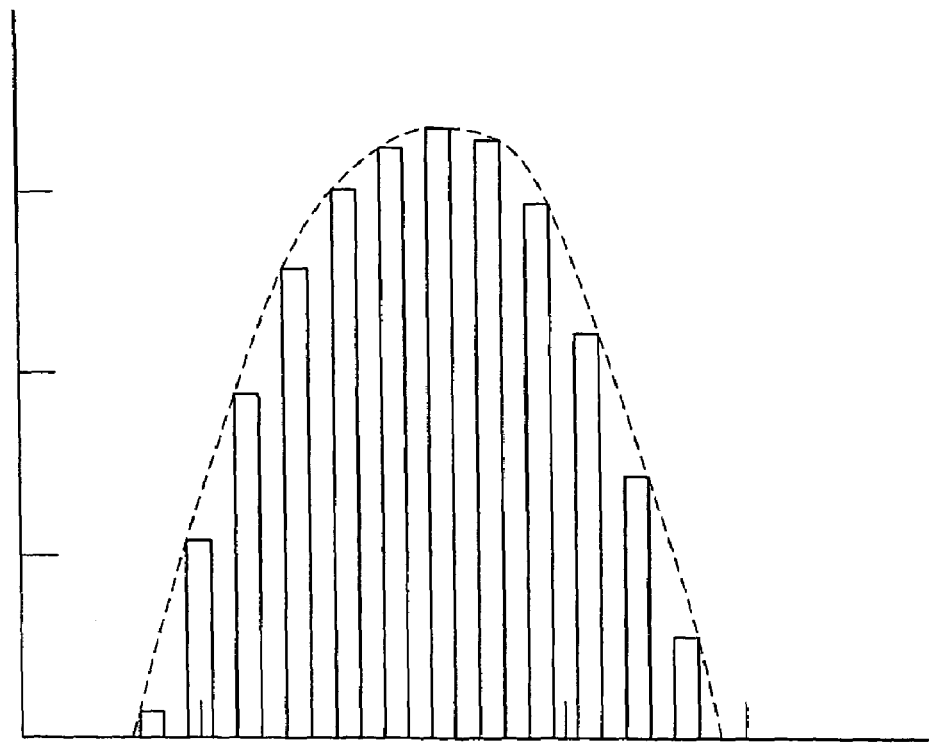
FIG. 4 is a schematic diagram showing the voltage waveform presented after a division with power transistors in the present invention.

According to one embodiment of the present invention, the operational steps of the present invention include:

obtaining a lowest voltage and a highest voltage, wherein the inverter device 10 is coupled to an external power source 12 to receive the voltage cycles of an alternating current and obtains a lowest voltage and a highest voltage of the voltage cycles, and FIG. 2 illustrates the voltage waveform of an input alternating current in the present invention, and hereafter, it is supposed that the alternating current is of 110V and 60 Hz, i.e. the lowest voltage would be 0V and the highest voltage would be 110V(step 1);

rectifying the alternating current, wherein the input voltage cycles of the alternating current mentioned in step 1 is rectified into the voltage cycles of a direct current, and the alternating current signal is rectified into a direct current signal, and referring to FIG. 3, a full-wave rectification is adopted herein, and the output thereof is a pulse direct current signal, and after the rectification of an array of diodes, the highest voltage portion would be of 155V or so(Hereafter, the factor of power loss is not to be considered temporarily)(step 2);

obtaining voltage pulse, wherein a working frequency is set to divide each of the direct current cycles mentioned in step 2, which ranges in the lowest voltage–the highest voltage–the lowest voltage manner, into multiple continuous voltage pulses via integrated circuit's outputting a frequency-controlling value to power transistors(MOS), and the multiple continuous voltage pulses created by the division is shown in FIG. 4, and wherein the square-wave signal output from the power transistors is modified via an inductance into a sinusoidal-wave-like signal to provide for a transformer unit (piezoelectric transformer) (step 3) 14;

outputting a variable voltage, wherein a transformer unit 14 of the inverter 10 receives each of the multiple continuous voltage pulses, and the transformer unit (piezoelectric transformer) 14 acts in response to each of the multiple continuous voltage pulses and corresponding to the voltage cycle ranging between the lowest and the highest voltage, and a power transformation is undertaken therein to output a variable voltage signal to a load, and owing to the characteristics of a resonant frequency of the piezoelectric-transformer type inverter itself, any voltage input will actuate the piezoelectric-transformer type inverter to oscillate to generate a piezoelectric effect to obtain a load voltage (step 4).

Figure 5:
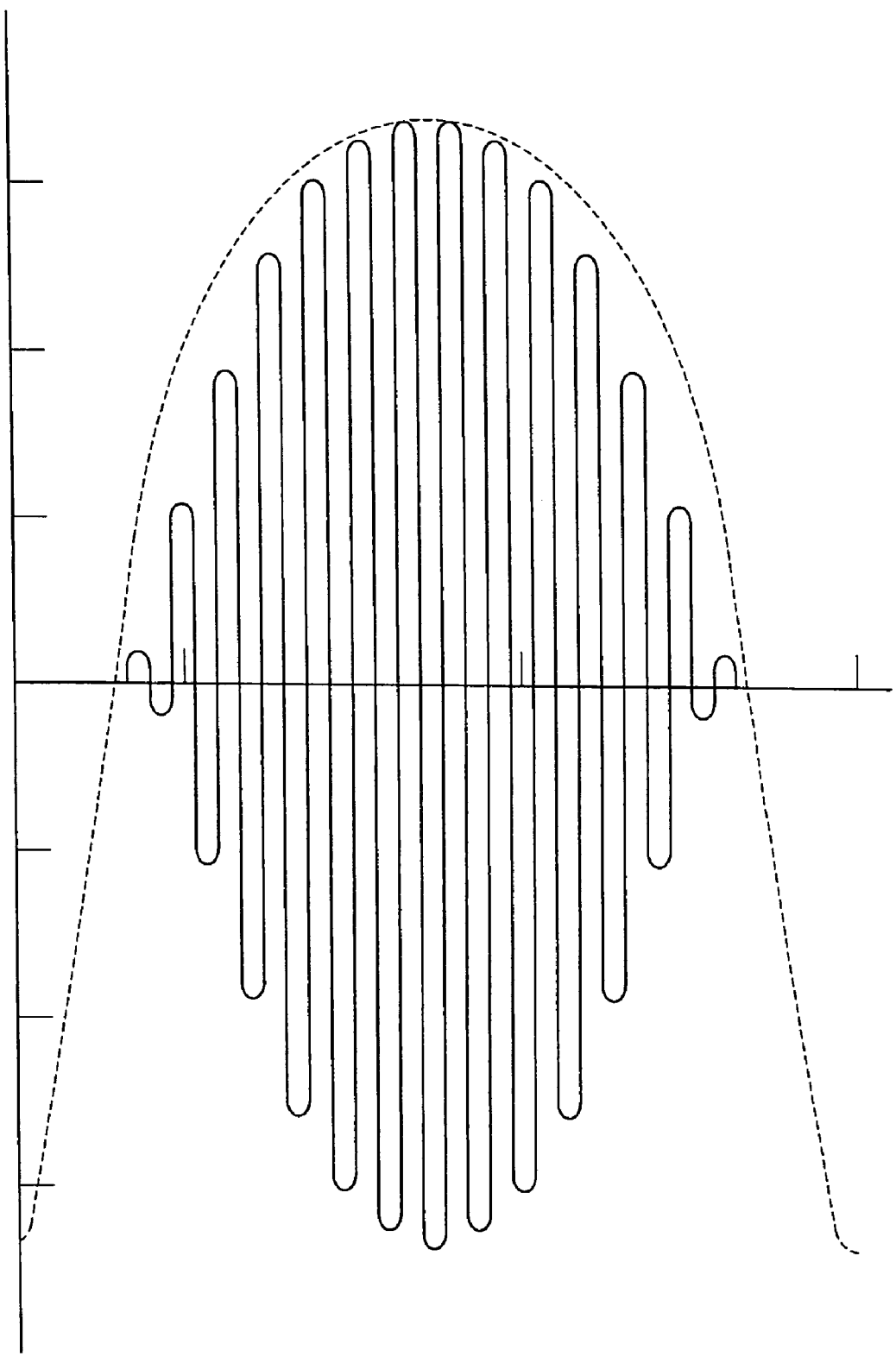
FIG. 5 is a schematic diagram showing the working voltage waveform of an inverter in the present invention.
Figure 6:
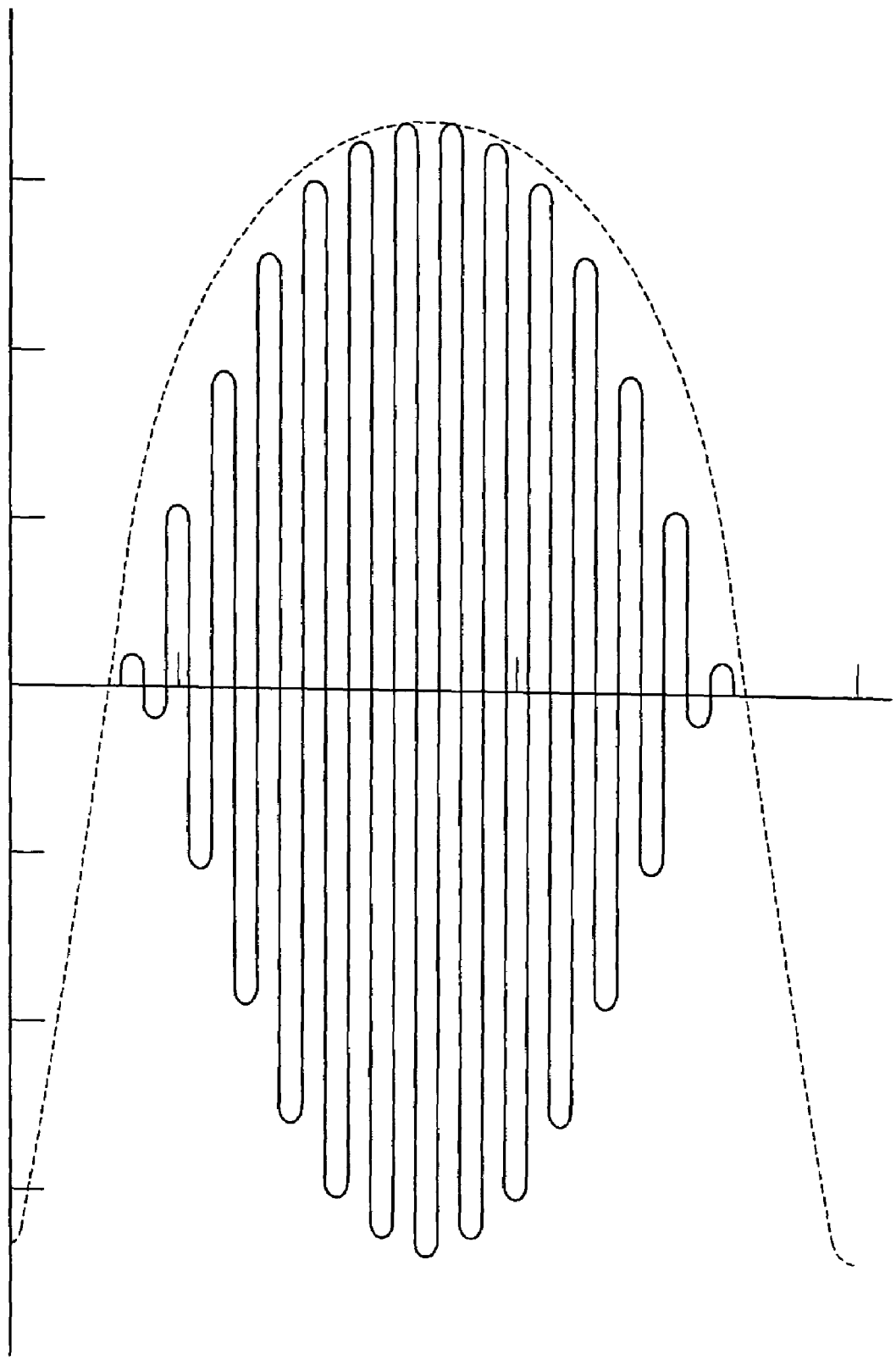
FIG. 6 is a schematic diagram showing the output current waveform of an inverter in the present invention.
Figure 7:
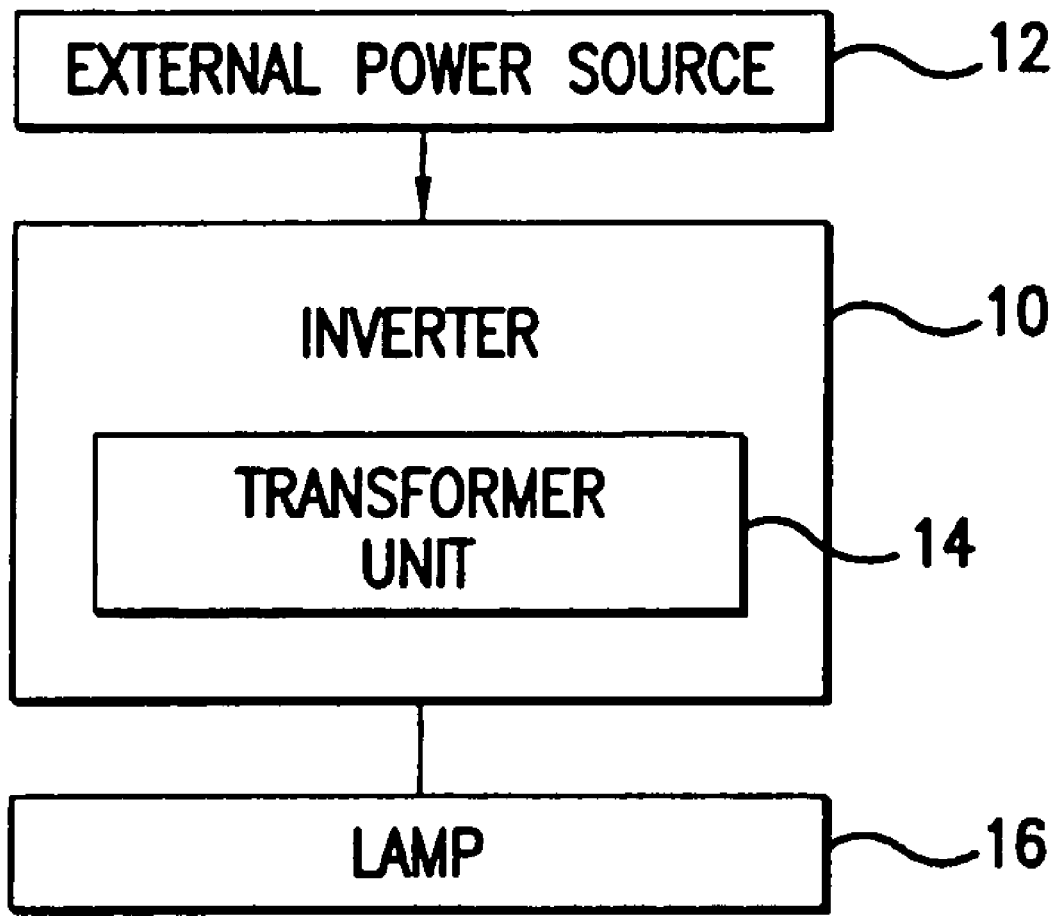
FIG. 7 is a schematic diagram showing.

Referring to FIG. 5 and 6, it is obvious that, as the electrical energy input to to load, which comes from the actuated acts of the transformer unit 14 whereto the working voltage is input, are of a quasi-sinusoidal waveform, all the corresponding current will also provides for the load and become an active current. Thus, the present invention can accomplish the power-factor regulating effect efficiently.

Further, as the piezoelectric-transformer type inverter begins to operate from the input of the lowest voltage and operates under a smooth-rising and smooth-dropping oscillating mode of the multiple continuous voltage pulses whose envelope ranges between the lowest and the highest voltage, the life of the piezoelectric-transformer type inverter is raised effectively.

The setting of the working frequency of a load's packet should correspond to the product, which the present invention is physically applied to. If to present invention is applied to a liquid crystal display panel, the load will be a cold cathode fluorescent lamp (CCFL) 16. As the liquid crystal display panel is an electronic production viewed by the human eyes, a flicker frequency acceptable for the human eyes should be considered in setting the working frequency. The working frequency should be higher than 60 Hz, and the higher the working frequency, the less the flicker effect's influence on the human eyes. Generally speaking, the working frequency of the piezoelectric-transformer type inverter is 72 KHz, i.e. the present invention can divide the voltage cycle raging from the lowest–the highest–the lowest voltage into 1200 continuous voltage pulses. As each of the continuous voltage pulses actuates the piezoelectric transformer to operate to output a power to drive the load to light up, the CCFL will represent a flicker mode of a gradually-changing brilliance in a dark–light–dark way, however, as the flicker frequency is beyond the human eyes' sense, it is harmless to the human eyes.

In order to avoid a suspension state of the piezoelectric-transformer type inverter, a small-sized compensation capacitor or a correcting compensation circuit can be added to step 2 mentioned above to make the lowest voltage non-zero V; however, the compensation value is proposed to be less than 20% of the highest voltage.

If the present invention is applied to a neon lamp, the working frequency would be set to be less than 60 Hz, and a flickering effect of the neon lamp will be represented. It is even better to take a half-wave rectification in step 2 of rectifying the alternating current, and thus an intermittent lighting up is further provided.

Those described above are only the preferred embodiments of the present invention, and it is not intended to limit the scope of the present invention. Any equivalent modification and variation according to the appended claims of the present invention is to be included within the scope of the present invention.

What is claimed is:

1. A method of determining a working voltage of an inverter, characterized by the following steps:

obtaining a lowest voltage and a highest voltage, wherein said inverter receives input voltage cycles of an alternating current and obtains a lowest voltage and a highest voltage of said voltage cycles of said alternating current (step 1);

rectifying said alternating current, wherein said input voltage cycles of said alternating current in step 1 is rectified into voltage cycles of a direct current, and said alternating current signal is rectified into a direct current signal (step 2);

obtaining voltage pulses, wherein a working frequency is set to divide each one of said voltage cycles of said direct current in step 2, and each one of said voltage cycles of said direct current, which ranges in said lowest voltage–said highest voltage–said lowest voltage manner, is divided into multiple continuous voltage pulses (step 3);

outputting a variable voltage, wherein a transformer unit of said inverter receives each one of said multiple continuous voltage pulses, and said transformer unit acts in response to each one of the multiple continuous voltage pulses and corresponding to said voltage cycle ranging between said lowest voltage and said highest voltage to output a variable voltage signal to a load, and on said load receiving said variable voltage signal, said load begins to operate (step 4).

2. The method of determining a working voltage of an inverter according to claim 1, wherein said direct current signal is a pulse direct current signal.

3. The method of determining a working voltage of an inverter according to claim 1, wherein said load is a cold cathode fluorescent lamp.

4. The method of determining a working voltage of an inverter according to claim 1, wherein said load operates to represent a flickering light of a gradually-changing brilliance in a dark–light–dark way.

5. The method of determining a working voltage of an inserter according to claim 1, wherein said rectifying can be a full-wave rectification or a half-wave rectification.

6. The method of determining a working voltage of an inverter according to claim 1, wherein said transformer unit can be a piezoelectric transformer or a winding transformer.

* * * * *